United States Patent [19]

Black et al.

[11] Patent Number: 6,091,157
[45] Date of Patent: Jul. 18, 2000

[54] METHOD TO IMPROVE INTERNAL PACKAGE DELAMINATION AND WIRE BOND RELIABILITY USING NON-HOMOGENEOUS MOLDING COMPOUND PELLETS

[75] Inventors: J. Courtney Black, San Jose; Richard C. Blish, II, Saratoga; Colin D. Hatchard, Campbell, all of Calif.

[73] Assignee: Advanced Micro Devices, Inc., Sunnyvale, Calif.

[21] Appl. No.: 08/986,085

[22] Filed: Dec. 5, 1997

[51] Int. Cl.$^7$ .................................................... H01L 23/29
[52] U.S. Cl. .......................... 257/790; 257/789; 257/795; 257/788; 257/784; 257/666; 257/787; 438/124; 438/127; 438/123
[58] Field of Search ..................................... 257/787, 788, 257/789, 790, 791, 792, 793, 795, 678, 687, 786, 666, 667, 672, 709, 784; 438/124, 127, 123

[56] References Cited

U.S. PATENT DOCUMENTS

| | | | |
|---|---|---|---|
| 5,097,317 | 3/1992 | Fujimoto et al. | 257/786 |
| 5,641,997 | 6/1997 | Ohta et al. | 257/788 |

*Primary Examiner*—Tom Thomas
*Assistant Examiner*—Luan Thai
*Attorney, Agent, or Firm*—LaRiviere, Grubman & Payne, LLP

[57] ABSTRACT

Method for implementing a multi-phase plastic package for electronic components, and packaged electronic components produced according to the method. The present invention contemplates the use of molding compounds having two or more discrete phases in a transfer molding process wherein a temperature differential is induced between the electronic component to be packaged and the mold of the molding apparatus prior to molding. Each of the molding compound phases, when used in a current transfer molding apparatus, generates a separate layer in the resultant package, and each of the resultant layers possesses certain unique properties. In its simplest implementation, the present invention provides a two-phase molding compound pellet which provides an outer layer containing mold release compounds to facilitate release of the completed packaged device from the mold, and an inner layer without mold release agents. Other implementations include multiple layers. One such implementation provides for an inner layer without flame retardants and a layer exterior to the inner layer containing flame retardants. In this manner, chemical interaction between the flame retardants and the encapsulated device is precluded. Other adjuncts may, with equal facility, be implemented in such additional layers as a given application may require.

2 Claims, 3 Drawing Sheets

SECTION I-I'

METHOD TO IMPROVE INTERNAL PACKAGE DELAMINATION AND WIRE BOND RELIABILITY USING NON-HOMOGENEOUS MOLDING COMPOUND PELLETS

TECHNICAL FIELD

The present invention relates to the plastic packaging of electronic components. More particularly, the present invention relates to plastic resin encapsulation of integrated circuits; to a methodology employing non-homogeneous molding compound preparations for reducing the delamination of the resin encapsulant from the electronic components, and to the encapsulated electronic components, including plastic-resin encapsulated integrated circuits, produced according to the method.

BACKGROUND ART

The following discussion of the art of the plastic packaging of electrical components, especially of integrated circuits is, in part, summarized from Chapter 18, "Packaging" in *Microchip Fabrication*, pp. 539–586, Peter van Zant, McGraw-Hill, 1997. This background information is herewith incorporated by reference.

After wafer fabrication, semiconductor chips undergo several processes to prepare the chips for eventual use. By way of illustration, but not limitation, some of these processes include: backside preparation; die separation; die pick; inspection; die attach; wire bonding; pre-seal inspection; package sealing; plating; trimming; marking; and final testing. Many of these processes can be categorized as part of the packaging, or enclosure process.

One form of enclosure common to semiconductor or integrated circuit (IC) manufacture is the molded epoxy package. Epoxy packages perform the four basic requirements of an electronic package for the circuit chip, or die ("chip") they house: they support a substantial lead system for connecting the device to the system component which will utilize it; they provide physical protection of the device from breakage, contamination and abuse; they protect the device from environmental hazards such as chemicals, moisture and gasses which could interfere with device performance; and they provide a path for dissipating the heat generated by the functioning of the device. Epoxy packaging presents several major advantages over some other device packaging technologies: it is light in weight, low in cost, and high in manufacturing efficiency.

One method of epoxy packaging of semiconductor devices is illustrated in prior art FIGS. 1 and 2. Having reference to those figures, this methodology is explained as follows: after die separation (and in some cases, after some of the previously mentioned steps, the die, 1', concentric with device 1, is attached and bonded to a composite lead frame, 2. In the exemplar here presented, lead frame 2 includes horizontal rails, 5, and vertical tie bars, 7, and provides a plurality of lead systems for connecting to the semiconductor dice (not shown), thereby producing the useful individual device. In this example there are provided a plurality of individual device lead frames 2, each having mounted thereon a further plurality of dice, 1'. After die mounting, the lead frames having the dice mounted thereon are often given some form of pre-seal inspection.

After the pre-seal inspection, the lead frames are transferred to a molding apparatus. Commonly used in this procedure is a transfer molding process which encapsulates and surrounds each of the dice and at least a portion of the lead frame assembly with a plastic encapsulant, or molding compound. Commonly utilized molding compounds include, but are not limited to: epoxies, monomers, polymers, and other resins. In the exemplar here presented, a silica-filled epoxy is utilized as the molding compound, or encapsulant.

The lead frames are placed in a mold, here a two-part mold consisting of mold halves 20 and 21. At least one mold half, often the bottom, has formed therein a gate, 10. The mold halves are clamped together, typically with some force, and often a portion of the lead frames, 2, completes the mold cavity, 16. The vent, 24, which provides a path for escaping air during the transfer molding process, is typically filled with the encapsulant during that operation.

After the mold has been clamped about lead frames 2 and dice 1', the ram assembly of the molding apparatus is charged with a quantity of molding compound, for instance as a homogenous pellet, through sprues 14. A prior art homogenous molding compound pellet, 60, comprising a quantity of silica-filled epoxy incorporating all the adjuncts desired for the package, is shown at prior art FIG. 6. The epoxy material may have been previously softened by means of heating or chemical reaction. The transfer molding apparatus then induces pressure, usually by means of a ram in operative combination with sprue 14, on the molten, viscous epoxy and it flows from sprues 14 through a series of runners, 12, through tapered sections 11 of gates 10, and thence into mold cavities 16. As the ram (not shown) continues to apply pressure to the mass of liquid epoxy, it is then forced around the integrated circuit dice, 1', encapsulating the dice and forming the individual packages, or devices, 1.

After the epoxy is at least partially set, the molds are separated, and the lead frame assembly is removed therefrom. This assembly may then be further cured by an oven or other heat means. Following final curing, the packages undergo further processing including, but not limited to: plating; runner removal; de-flashing; marking; and final testing. The finished packaged component is then ready for use.

Referring now to FIG. 3, a prior art plastic resin encapsulated integrated circuit device, 1, formed in accordance with the previously discussed process is shown. Device 1 comprises an integrated circuit (IC) device, 1', for instance a silicon IC chip. Chip 1' is bonded to a copper die paddle 30, in this exemplar by means of a layer of silver plating, 32. Device 1 further comprises at least one, and more generally a plurality of leads 34. Leads 34 are electrically connected in this example by means of wire bonds 36. Wire bonds 36 are typically first bonded to the correct chip bonding pad and then spanned to an inner end of lead 34. Lead 34 is commonly, but not exclusively, manufactured from copper, and may include a layer of plating, for instance silver plating 38, to increase the reliability of the wire bonding process. Leads 34 and die paddle 30 are typically formed utilizing the lead frame technology previously discussed. The previously discussed components are encapsulated, in this prior art example, by means of a homogeneous mass of silica-charged epoxy, 40, in the manner hereafter discussed.

Prior art molding compounds, for instance the homogenous pellet shown in prior art FIG. 6, typically consist of a homogeneous mixture of silica, epoxy (whether plain or brominated), and one or more molding compound adjuncts including, but not necessarily limited to: flame retardants, including antimony trioxide; cross-linking agents; inhibitors; ionic getters; and mold release agents.

Transfer molding compounds, including the previously discussed epoxy molding compounds commonly used for the encapsulation of silicon IC devices, have variable adhesion to the several elements encapsulated within the package. In particular, adhesion of prior art molding compounds to the silver plated lead frames, as well as to the gold bonding wires, is poor. This is partially due to the fact that both gold and silver are substantially noble metals, which is to say that neither is particularly chemically reactive and neither forms a tenacious oxide. The biggest part of the problem, however, is due to the composition of the molding compound itself, and most particularly to the homogenous inclusion of molding compound adjuncts, including mold release agents therein.

Release agents typically include waxes (commonly carnauba or its synthetic equivalent) and stearates (commonly as the calcium or zinc salts of stearic acid). These release agents are incorporated into molding compounds to permit the encapsulated IC to be removed easily from its mold. The mold release compounds are typically incorporated into the molding compound, as the topical application of the mold release compound to the mold itself for each "shot" would be time-consuming, messy, and potentially incomplete. Naturally, these waxes and stearates, whose typical melting points are on the order of 80° to 180° C., prevent sticking of the molding compound to the mold. Their presence in the molding compound, however, has a negative effect: they impede the adhesion of the molding compound to the lead frame and to the silicon chip as well.

A commonly used fire retardant system in encapsulated semiconductor manufacture is the inclusion in the molding compound of antimony trioxide and brominated epoxy. The use of flame retardants is mandated by the fact that some encapsulated electronic devices have in past generated sufficient heat whereby the flash point of the molding compound has been reached and a fire ensued. In the event that the encapsulant containing this fire retardant system reaches its flash temperature, antimony trioxide and bromide combine to form antimony tribromide, a dense, heavy, flame retardant gas, which gas precludes the flames' spread. Unfortunately, both of these flame retardant materials, as well as other known flame retardant materials, when brought into contact with an encapsulated semiconductor device's wire bonds to degrade the wire bond's reliability. This degradation typically comes as a result of the chemicals causing a failure of the inter-metallic bond between the bonding wire and at least one of the lead and/or the bonding pad on the chip.

The preceding discussion presents a broad overview of the plastic packaging of electrical components, as practiced by others having ordinary skill in the art. Details of one example of such a molding process can be found in U.S. Pat. No. 4,697,784 to Schmid.

Homogenous molding resins were never intended to provide a hermetic seal around the plastic encapsulated IC chip, but they are expected to preserve the initial or time zero (pre-stress) properties and functionality thereof. Indeed, most authorities on IC packaging refer to the use of epoxy resins or copolymers, including silicones, as "non-hermetic". This gives rise to a first class of problems associated with current homogeneous molding compound technology, relating to the unwanted adsorption of water by the packaged device. A second class of problems, which may or may not be exacerbated by non-hermetic sealing of the device results from the chemical and metallurgical interactions between at least some of the integrated circuit components and additives, or adjuncts in the homogenous encapsulant.

The fact that the previously discussed plastic resin encapsulation methods and materials do not provide a perfectly hermetic seal for the enclosed electronic component has given rise to a number of technical imperfections. One such imperfection is the internal delamination which can occur within a plastic-encapsulated electronic device, especially an integrated circuit, after the device adsorbs an unwanted degree of humidity or moisture. When such a device contained adsorbed or entrained water is exposed to rapid heating during assembly or component use, particularly use in surface mount packaging technology, the heat generated when the device is powered can cause the moisture entrapped within the package to flash to steam, resulting in a rapid internal package delamination. This delamination can disrupt normal IC function or connection with the printed circuit board. Internal delamination can also disturb the stress and strain distribution in the package, perhaps thereby leading to package fracture, disruption of proper heat dissipation and impaired performance in high humidity environments.

Normal internal delamination may be undetectable from external inspection, and may only be detected when the device fails. In its more severe form, the package may expand and even rupture due to hydraulic expansion. This is second technical imperfection, sometimes referred to as the "popcorn" phenomenon, and is most commonly found in surface mount technology devices.

The problems associated with entrained moisture within encapsulated IC devices are well known, and their regulation and/or elimination is the subject of a number of technical standards promulgated by the Joint Electron Device Engineering Council (JEDEC) of the International Electronics Association (IEA). JEDEC Standards JESD22A103 and JESD22A104 set forth a number of standard levels which define levels of entrained moisture or humidity.

Because of their inherently superior manufacturability, IC devices meeting the low entrained moisture requirements of a JESD22A104 Level 1 device are potentially more reliable than devices meeting lower, less stringent standards. Level 1 devices are also more commercially valuable than devices which can only meet a lower standard. Accordingly, IC manufacturers currently go to extreme lengths to provide Level 1 devices wherever possible.

Measures undertaken by manufacturers to provide their customers JEDEC Level 1 components include the practice commonly known as "bake and bag". This practice consists of heating the finished components to a given temperature for a given period of time in order to dry them out (thereby ensuring at least temporary protection against "popcorn" and delamination), and then immediately sealed in hermetically sealed containers with a desiccant. In this manner the package, at least as shipped from the manufacturer, meets customer expectations.

JEDEC Level 1 parts are greatly preferred by IC assemblers as the moisture performance rating ("popcorn invulnerable") implies an unlimited lifetime on the surface mount technology floor device, so the assembler need not watch the clock nor re-bake the IC devices if too much time has elapsed from the opening of the bag until the assembly of the device into the apparatus into which it is incorporated.

The work of others to overcome the vulnerability of plastic-encapsulated electronic devices to retaining sufficient entrained moisture to preclude level 1 certification has centered on the search for a "magic combination" of an ideal reduced-hygroscopicity homogenous molding compound coupled with a specific process technology using the compound in an ideal manner, which combination results in the production of packaged device having reduced vulnerability to attack by humidity. The reality, unfortunately, is that all such combinations to date have fallen short of desired performance levels. This is particularly true for more massive IC packages, and so the "fall back" position currently utilized by many manufacturers is to characterize the JEDEC performance level as comprehensively as possible and inform the user of that level, so that the user can manage his or her processes, such that popcorn failures are reduced.

In summary, the current situation is largely a proposition of "build it and then characterize how good or bad the chip is". There is currently no means available reliably to ensure that substantially all the integrated circuits encapsulated during manufacture meet JEDEC Level 1 standards, thereby preventing internal package delamination, and susceptibility of the device to popcorn failure.

The second broad class of problems with current homogenous molding compound technology is those caused by the flame retardants in the molding compounds. A commonly used flame retardant system in encapsulated semiconductor manufacture is the inclusion in the molding compound of antimony trioxide and brominated epoxy. The use of flame retardants is mandated by the fact that some encapsulated electronic devices have in past generated sufficient heat whereby the flash point of the molding compound has been reached and a fire ensued. In the event that the encapsulant containing this flame retardant system reaches its flash temperature, antimony trioxide and brominated epoxy combine to form antimony tribromide, a dense, heavy, flame retardant gas, which gas precludes the flames' spread.

The use of the previously discussed flame retardant materials, as well as other known flame retardant materials, gives rise to the second discussed problem with current homogenous molding compounds. Some of these flame retardant chemicals, especially brominated epoxy, when brought into contact with an encapsulated semiconductor device's wire bonds tends to degrade the wire bond's reliability. This degradation typically comes as a result of the flame retardant or retardants causing a degradation or even failure of the inter-metallic bond between the bonding wire and at least one of the lead and/or the chip bonding pad.

What is clearly needed therefore, is a methodology which encapsulates electronic devices reliably, thereby ensuring such intimate bonding of the molding compound with the encapsulated IC chip, lead frame components, and bonding wires that JEDEC Level 1 performance can routinely be achieved and maintained. What is further needed is a methodology which precludes the vulnerability of integrated circuit bond wire degradation due to chemical or metallurgical attack. What is further desirable is that the methodology be capable of implementation without recourse to extensive re-tooling or re-engineering of the current electron device encapsulation process or equipment.

A possible solution to each of these problems inherent with current homogenous molding compound technology may reside in the results of an experiment conducted to determine the behavior of discrete molding compounds injected into a single mold. In this experiment, a succession of molding compound pellets having substantially identical chemical compositions, but with different coloring, were inserted into a transfer molding apparatus in the order: white, red, green and black compounds, and injected in one shot. These pellets, of course, replaced the all black pellets previously discussed.

It was expected that the same order of colors in the encapsulated device would be found from the vent back toward the gate, much like layers filling a bathtub. Surprisingly, what was discovered upon sectioning the encapsulated device was that the outer portion of the package was in fact the first color injected, in this case white, followed by a red layer concentric within the white layer, a green layer concentric within the red layer, and the black layer concentric within the green. In other words, the deposition and order of layers of molding compound within a transferred molding apparatus, where the mold is substantially warmer than the IC devices and lead frames enclosed therein, is clearly more a function of the higher temperature and thermal mass of the mold than it is of the physical order in which the molding compound is inserted therein. It is believed that the first molding compound injected into the mold tends to flow towards the elevated temperature and relatively larger thermal mass of the mold in preference to the relatively cool, relatively smaller thermal mass of the IC chip. It is believed that polymerization proceeds most quickly at the warmest points of the assembly, i.e., the mold itself.

DISCLOSURE OF INVENTION

The present invention teaches the use of a non-homogeneous pellet of molding compound in which the bottom portion (i.e., the first portion of the pellet to be transferred to the encapsulated IC) has a composition similar to current homogeneous molding compounds in that it contains mold release agents, in particular waxes and stearates. Another portion of the non-homogeneous molding compound pellet taught by the present invention is free of mold release compounds, including the previously discussed waxes and stearates, but contains a chemical adhesion agent, perhaps one of the "silanes" commonly used in wafer fabrication (HMDS). In this manner, the first or bottom portion of the non-homogeneous molding compound pellet is first injected into the mold and substantially forms the outer portion of the package capsule, utilizing the mold release agents necessary to effect efficient release of the finished part from the mold on completion of the transfer molding process, while the inner portion of the capsule defines a molding compound having no mold release agents, thereby increasing the adhesion of the molding compound to the encapsulated electron device and lead assemblies. The intimate contact afforded by the use of a non-mold release compound bearing transfer mold compound results in a decreased susceptibility of the packaged component to the adsorption of water or excess humidity.

A further embodiment of the present invention contemplates the use of an additional portion of the non-homogeneous molding compound pellet, which portion is between the previously discussed portions, which additional portion contains the flame retardant required in many encapsulated electron devices. In this manner, the epoxy molded encapsulated package contains a first layer substantially disposed about the interior surface of the transfer mold, a third portion substantially disposed upon the silicon chip and lead frame assemblies, and a second portion disposed between the first and third portions, which second portion contains a flame retardant, for instance antimony trioxide and brominated epoxy, or the use of hydrated magnesium hydroxide (MgOH). Alternative flame retardant systems may, with equal facility, be implemented. By confining the flame retardant to this second layer as well as layers external thereto, no flame retardant materials are introduced into the package layer immediately adjacent to, and in intimate contact with the chip, wire bonds and leadframe assembly. In this manner the chemical interactions between the flame retardant, for instance brominated epoxy, antimony trioxide, and the previously discussed wire bond elements are obviated.

The present invention further contemplates the use of such additional layers required for other specific purposes in the completed packaged device, or to enhance the fabrication of the device. One such additional layer could include materials specifically designed to improve the thermal transfer characteristics of the package. This material could be formed as a separate, fourth, portion of the non-homogeneous molding compound pellet arrayed somewhere between the first and last portions. In this manner the heat transfer layer in the finished encapsulated electron device is substantially arrayed between the layer having mold release compounds to the exterior portion of the device and the layer containing the adhesive elements, for instance on the interior of the device immediately adjacent to and adhering to the electron device and its associated lead frames. Alternatively, thermal transfer material could be added to other layers where the presence of such material will not interfere with the devices functionality or reliability, or the ability of the package to be reliably removed from the mold once the molding process was completed As a further alternative to the invention described above, additional layers may be employed where required, and certain of the layers may be combined where the functions of the two layers' compounds are not mutually exclusive for some physical or chemical reason, so long as at least two discrete portions are utilized in the non-heterogeneous molding compound pellet.

Other features of the present invention are disclosed or apparent in the section entitled "DETAILED DESCRIPTION OF THE INVENTION".

BRIEF DESCRIPTION OF DRAWINGS

For understanding of the present invention, reference is made to the accompanying drawing in the following DETAILED DESCRIPTION OF THE INVENTION.

In the drawing.

Prior art

Prior art

Prior art

Prior art

DETAILED DESCRIPTION OF THE INVENTION

Figure 4:
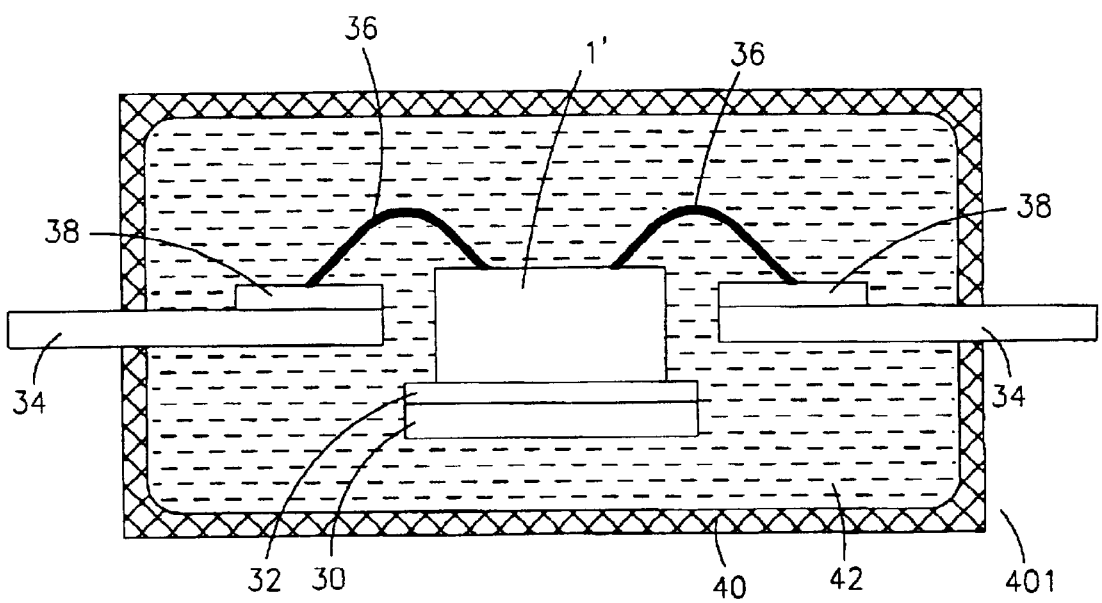
FIG. 4 is a transverse section through a plastic-encapsulated integrated circuit device incorporating the heterogeneous molding compound technology of the present invention

Referring now to FIG. 4, an encapsulated electron device 401 formed in accordance with a first preferred embodiment of the present invention is shown. Device 401 comprises chip 1' bonded to a copper alloy die paddle 30, in this embodiment by means of a layer of silver-loaded epoxy or polyimide adhesive 32. Device 401 comprises chip 1' bonded to a copper alloy die paddle 30, in this embodiment by means of a layer of silver-loaded epoxy 32. Device 401 further comprises at least one, and more generally a plurality of leads 34. Leads 34 are generally formed as part of a leadframe assembly and are electrically connected to the bonding pads (not shown) of chip 1' in this embodiment by means of wire bonds 36. Wire bonds 36 are typically first bonded to the correct chip bonding pad (not shown), spanned to an inner end of lead 34, and fixed in place in a manner well known to those having skill in the art. Leads 34 are commonly, but not exclusively, manufactured from copper alloy, and may include a layer of plating to increase the reliability of the wire bond process.

Leads 34 and paddle 30 are typically formed utilizing known lead frame technology. Device 401 differs from prior art device 1 in that the plastic package thereof is a multi-phasic structure formed of two discrete types of molding compounds 40 and 42. In this embodiment of the present invention, the package is a two-phase structure utilizing molding compounds having different formulations. In this embodiment, layer 40 is a silica-charged epoxy molding compound including a mold release agent and a flame retardant system. Layer 40 may further, and optionally, include one or more of the following components: cross-linking agents; inhibitors; and ionic getters. A currently available molding compound suitable for forming layer 40 is EME-7320AR, available from Sumitomo Bakelite, Tennoz Parkside Two, 5-8 Higashi-Shinagawa, 2-Kome, Shinagawa, Tokyo, 140 K1, Japan.

Layer 40 surrounds and further encapsulates an inner layer 42. Layer 42 in this embodiment comprises a further mass of silica-charged epoxy (optionally plain or brominated) and does not include flame retardants or mold release agents. Sumitomo EME-7320AR, modified so as to delete any mold release agents and flame retardants therefrom, may be used to form layer 42. Layer, or phase 42 may include cross-linking agents and/or ionic getters. The fact that, in this embodiment of the present invention, layer 42 contains no release agents enables this layer to intimately bond to all of the structures, previously discussed, which are encapsulated therein, thereby improving the bond between layer 42 and those structures, thereby improving package reliability. Moreover, since layer 42 coats and seals the integrated circuit components from contact with any of the other layers and layer 42 contains no flame retardants itself, disruptions to the intermetallic bond between bond wire 34 and structures to which it is attached are substantially eliminated.

Figure 1:
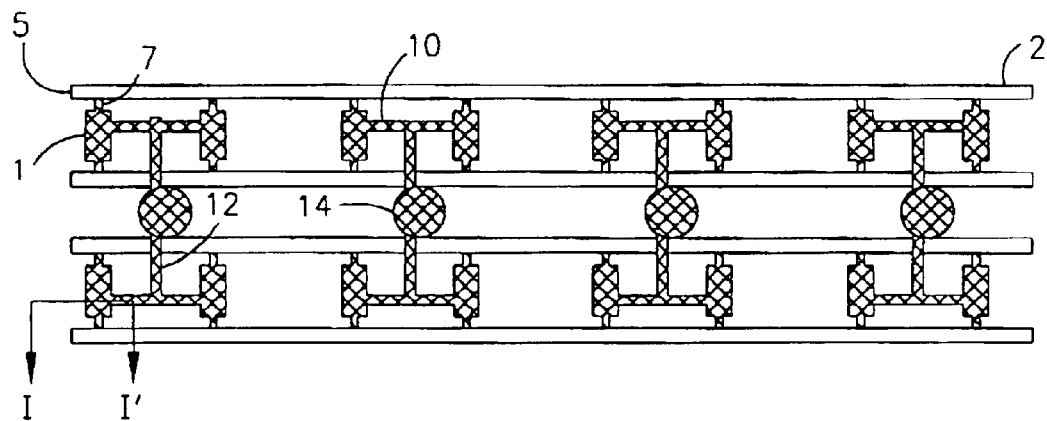
FIG. 1 is a plan view of a previous lead frame having molded thereon a plurality of sprue/runner/gate/device structures, the lead frame being removed from the mold which formed it.
Figure 2:
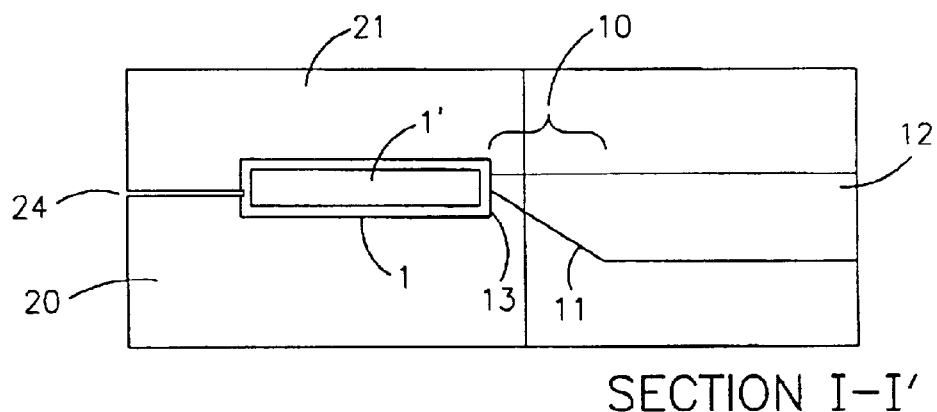
FIG. 2 is a transverse section through a portion of the mold which formed the previous sprue/runner/gate/device structure.
Figure 3:
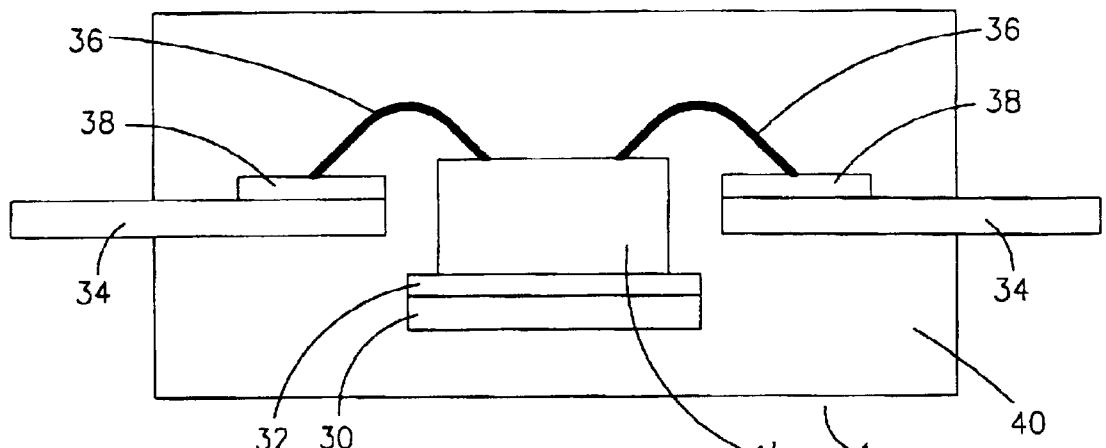
FIG. 3 is a transverse section of a plastic-encapsulated integrated circuit employing a homogeneous molding compound.
Figure 7:
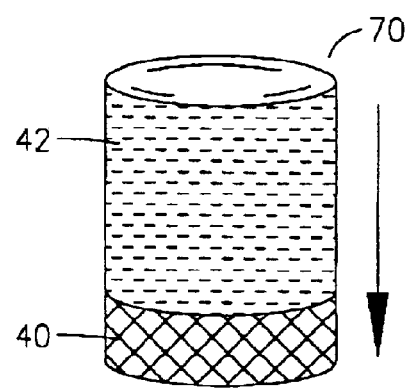
FIG. 7 is a two-phase heterogeneous molding compound pellet for implementing the two-phase plastic capsule as shown in FIG. 4.

Having further reference to FIG. 7, the methodology for forming device 401 is explained as follows: Chip 1' is attached to a lead frame assembly (not shown), including die paddle 30, utilizing silver plating 32. The lead frame assembly (not shown) further defines the previously discussed plurality of leads 34 having silver plated areas 38 deposited thereon. Further, the integrated circuit of device 401, including lead frame having chip 1' attached thereto, is completed by means of at least one and preferably a plurality of bond wires 36, in the manner well known to those having ordinary skill in the art. At this step in fabrication the completed lead frame assembly including the wire bonded die is loaded into the previously discussed transfer molding apparatus (not shown). A novel non-homogeneous pellet of molding compound, 70, is then loaded into the hydraulic ram assembly (not shown) of the transfer molding apparatus and softened as previously discussed. A temperature differential is induced between the lead frame assembly bearing dice 1' and the mold sections, for instance molds halves 20 and 21 shown in FIG. 2.

In one embodiment of the present invention, this temperature differential is induced by the simple expedient of the normal operation of the molding apparatus whereby the residual heat from previous molding cycles maintains mold halves 20 and 21 at a substantially higher than the lead frame assembly. Alternatively, the temperature differential may be induced in either or both of the completed lead frame assembly and the mold assembly by means of some combination of applied heating (which encourages polymerization) and cooling (which discourages polymerization) of one or both of these assemblies.

Once non-homogeneous molding compound pellet 70 reaches the required degree of fluidity, the ram assembly of the transfer molding apparatus, not shown, is actuated. This causes the now-liquid mass of molding compound (having two separate highly viscous phases or layers 40 and 42) to flow sequentially (with minimal mixing) in the direction of the arrow shown into mold halves 20 and 21 surrounding the lead frame assembly. As mold halves 20 and 21 define a structure having greater thermal mass and, in this example, higher temperature than the lead frame assembly, the first phase of molding compound 40 is differentially deposited on the interior of the mold surfaces. Thereafter, as the ram continues to push the mass of liquid molding compound into the mold cavity, layer 42 is formed interior to layer 40. As layer 42 contains no mold release compounds, it provides a more perfect and intimate bond with the electronics compounds which it encapsulates.

Figure 5:
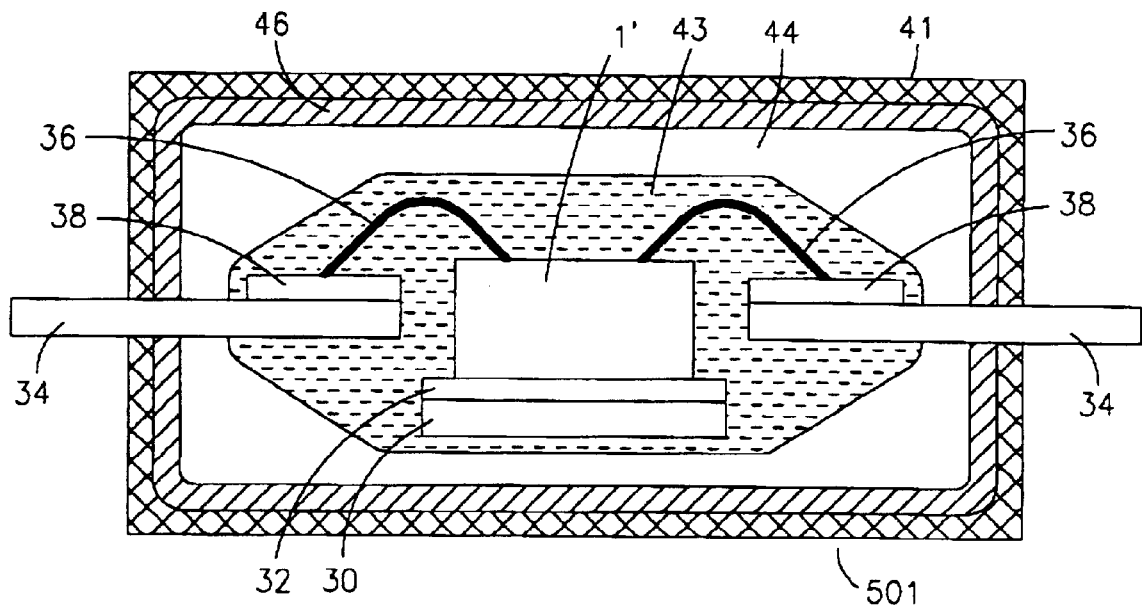
FIG. 5 is a second embodiment utilizing the principles of the present invention further implementing a plurality of plastic-encapsulating layers, each layer having particular properties.
Figure 6:
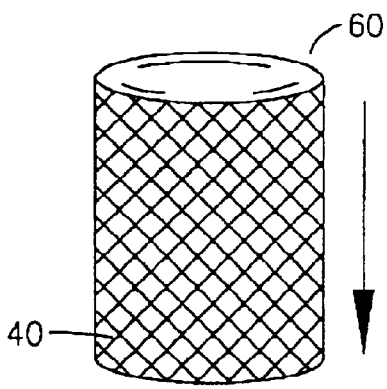
FIG. 6 is a homogeneous molding compound pellet.
Figure 8:
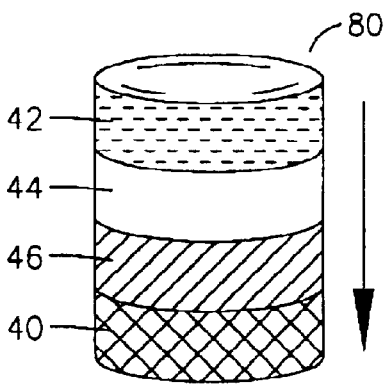
FIG. 8 is a multi-phase heterogeneous molding compound pellet for implementing the multi-phase capsule shown in FIG. 5.
Figure 9:
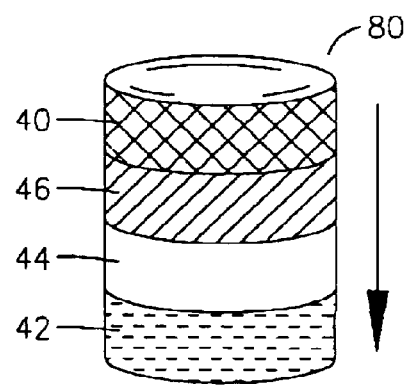
FIG. 9 is the multi-phase heterogeneous molding compound pellet of FIG. 8 inserted into a transfer molding apparatus in an orientation to enable another embodiment of the present invention, which utilizes a heated lead frame.

FIGS. 5, 8, and 9 show that the principles of the present invention may, with equal facility, be employed to form a plastic encapsulated electron device 501, the package of which defines a further plurality of layers. In this embodiment, the previously discussed completed lead frame assembly is loaded into the molds of the transfer and a non-homogeneous molding compound pellet, 80, as shown in FIG. 8 is loaded into the ram assembly of the transfer molding apparatus and, after liquefaction, urged into mold halves 20 and 21 (not shown) in the direction indicated by the arrow. In this embodiment, layer or phase 41 again contains mold release agents to enable the facile removal of the completed assembly from the transfer molding apparatus, and flame retardants. A molding compound having the desired properties for layer 41 is Sumitomo EME-7320AR. It may be further desirable to modify this compound to remove any thermal transfer material therefrom where such material is found to adversely affect mold life because of its abrasive properties. Depending on the degree of flame retardant protection required, layer 41 may or may not include a quantity of flame retardant material, as required.

Phase 43 is, in this embodiment, without mold release compound or flame retardants. And again, this feature ensures that the molding compound is formed in intimate bond with the encapsulated chip lead frame components and bonding wires whereby the desired JEDEC Level 1 performance is routinely attained. Once again, disruptions to the intermetallic bonds of bond wires 34 are precluded by the fact that phase 43 contains no flame retardants.

Layers 44 and 46 may be discretely formed to include one or more additional features. In this example, layer 44 is another epoxy molding compound formulated to include a quantity of aluminum nitride, titania, alumina, or quartz, which improves the thermal transfer characteristics of the overall package. Additionally, phase 46, in this embodiment is formulated to contain a quantity of fire-retardant material, for instance of antimony trioxide and brominated epoxy. Device 501 shown in FIG. 5 is formed utilizing the non-homogeneous molding compound pellet 80 shown in FIG. 8, by injecting the molten pellet in the direction shown by the arrow of that figure.

An alternative embodiment to the present invention contemplates the induction of the thermal differential between the molding apparatus and the lead frame assembly by heating the lead frame assembly prior to insertion into the mold halves of the transfer molding apparatus. In this manner, the lead frame assembly is the hotter element, and deposition of the molding compound flows from the lead frame outward. When this embodiment is selected, in order to form device 501 pellet 80 is inserted into the ram assembly of the transfer molding apparatus in the opposite direction, as shown by the arrow in FIG. 9. In this manner the first layer, or phase, into the mold is selectively deposited about the dice 1', bond wires 36, and lead frames 34. The remaining phases are then deposited in the cavity in the order from warmest, i.e., closest to the relatively warm lead frame assembly, to coolest, i.e., the mold.

It will be obvious to those having ordinary skill in the art that the number and composition of the several layers defining a plastic package may be modified as required to suit any particular packaging requirement. The principles of the present invention specifically contemplate all such arrangements. Further, the relative thicknesses of the several layers illustrated and described herein are for illustrational purposes only. These thicknesses may be modified as required to provide required flame retardant, mold release, thermal transfer, and hermetic protection.

While the principles of the present invention contemplate the formation of non-homogeneous pellets as previously described, it would be obvious to those having ordinary skill in the art that the advantages taught herein may, with equal facility, be implemented by loading a plurality of individual pellets, having the correct property, into the ram assembly of a transfer molding apparatus in the proper order. The principles of the present invention specifically contemplate such an embodiment.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the use of alternate molding compounds, adjuncts thereto, the order in which those compounds are introduced into the molding apparatus, and the application of the technology disclosed herein to alternate electronic components are all contemplated by the principles of the present invention. The invention disclosed herein may be practiced without any element which is not specifically disclosed herein.

We claim:

1. A plastic-encapsulated electronic device formed by the steps of:

inducing a temperature differential between an electronic device and a mold for packing the electronic device;

enclosing the electronic device in the mold; and injecting a heterogeneous quantity of multi-phase epoxy resin molding compound into the mold enclosing the electronic device, whereby a first phase of the multiphase molding compound is formed into a first layer, having the property of being free of mold release compounds, in intimate contact with the electronic device, and a second phase forms a second layer which surrounds and further encapsulates the first layer, the second layer being substantially bonded to the first layer.

2. The plastic-encapsulated electronic device of claim 1 further including a mold release compound in the second layer and formed by the additional step of:

disposing, in the second phase, a quantity of mold release compound, whereby the second layer further includes the mold release compound for facilitating release of the plastic-encapsulated electronic device from the mold.

* * * * *